(12) United States Patent
Biziere et al.

(10) Patent No.: US 7,855,555 B2
(45) Date of Patent: Dec. 21, 2010

(54) METHOD AND APPARATUS FOR MAGNETIC FIELD MEASUREMENTS USING A MAGNETORESISTIVE SENSOR

(75) Inventors: Nicolas Biziere, Orsay (FR); Claude Fermon, Orsay (FR); Myriam Pannetier, Gif sur Yvette (FR)

(73) Assignee: Commissariat á l'énergie atomique et aux énergies alternatives, Paris (FR)

( * ) Notice: Subject to any disclaimer, the term of this patent is extended or adjusted under 35 U.S.C. 154(b) by 597 days.

(21) Appl. No.: 11/665,693

(22) PCT Filed: Oct. 17, 2005

(86) PCT No.: PCT/EP2005/055304

§ 371 (c)(1),
(2), (4) Date: Mar. 3, 2008

(87) PCT Pub. No.: WO2006/042839

PCT Pub. Date: Apr. 27, 2006

(65) Prior Publication Data

US 2008/0186023 A1    Aug. 7, 2008

(30) Foreign Application Priority Data

Oct. 18, 2004   (FR) .................................. 04 10988

(51) Int. Cl.
*G01R 33/09*    (2006.01)
*H01L 43/08*    (2006.01)

(52) U.S. Cl. ................. 324/252; 324/207.21; 338/32 R
(58) Field of Classification Search ................. 324/202, 324/207.21, 212, 252; 338/32 R; 327/510
See application file for complete search history.

(56) References Cited

U.S. PATENT DOCUMENTS

| 5,351,003 | A | 9/1994 | Bauer et al. |
| 6,031,273 | A | 2/2000 | Torok et al. |
| 6,191,581 | B1 | 2/2001 | Van Dau et al. |
| 7,570,046 | B2 * | 8/2009 | Keefover et al. ....... 324/207.12 |
| 2002/0060565 | A1 | 5/2002 | Tondra |
| 2003/0042902 | A1 * | 3/2003 | Kobayashi et al. .......... 324/252 |

* cited by examiner

*Primary Examiner*—Kenneth J Whittington
(74) *Attorney, Agent, or Firm*—Weingarten, Schurgin, Gagnebin & Lebovici LLP

(57) ABSTRACT

The device for measuring magnetic field by using a magnetoresistive sensor comprises at least one magnetoresistive sensor (5), a module (50) for measuring the resistance of the magnetoresistive sensor (5), a generator module (40, 6) for generating an additional magnetic field in the space containing the magnetoresistive sensor (5), and a control unit (60) firstly for selectively controlling the generator module (40, 6) to apply an additional magnetic field pulse possessing a first value with first polarity that is positive or negative and magnitude that is sufficient to saturate the magnetoresistive sensor (5), and secondly for selectively controlling measurement of the resistance of the magnetoresistive sensor (5) by the module (50) for measuring resistance.

23 Claims, 6 Drawing Sheets

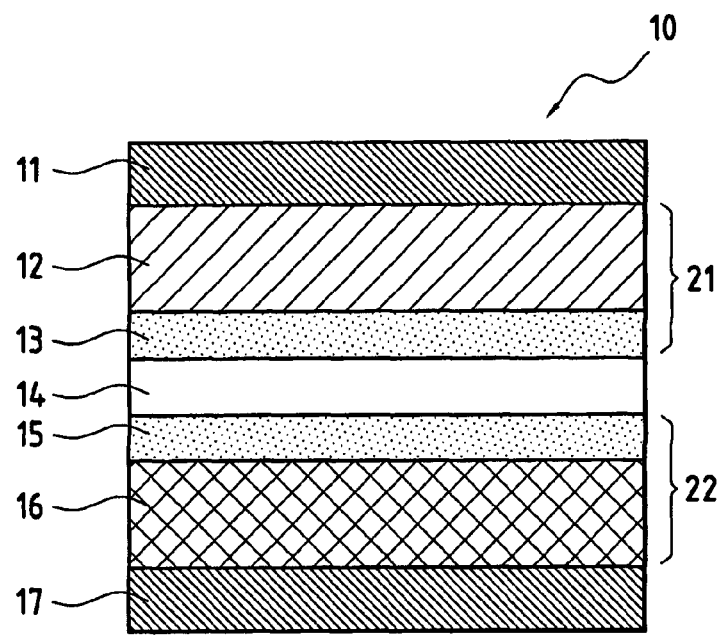
FIG.1
FIG.2
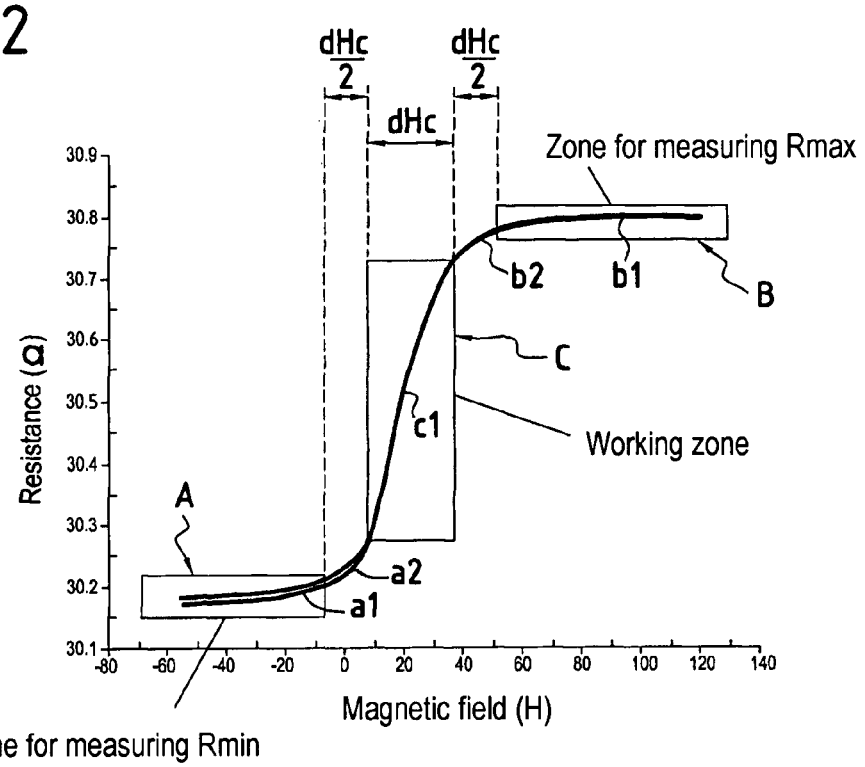

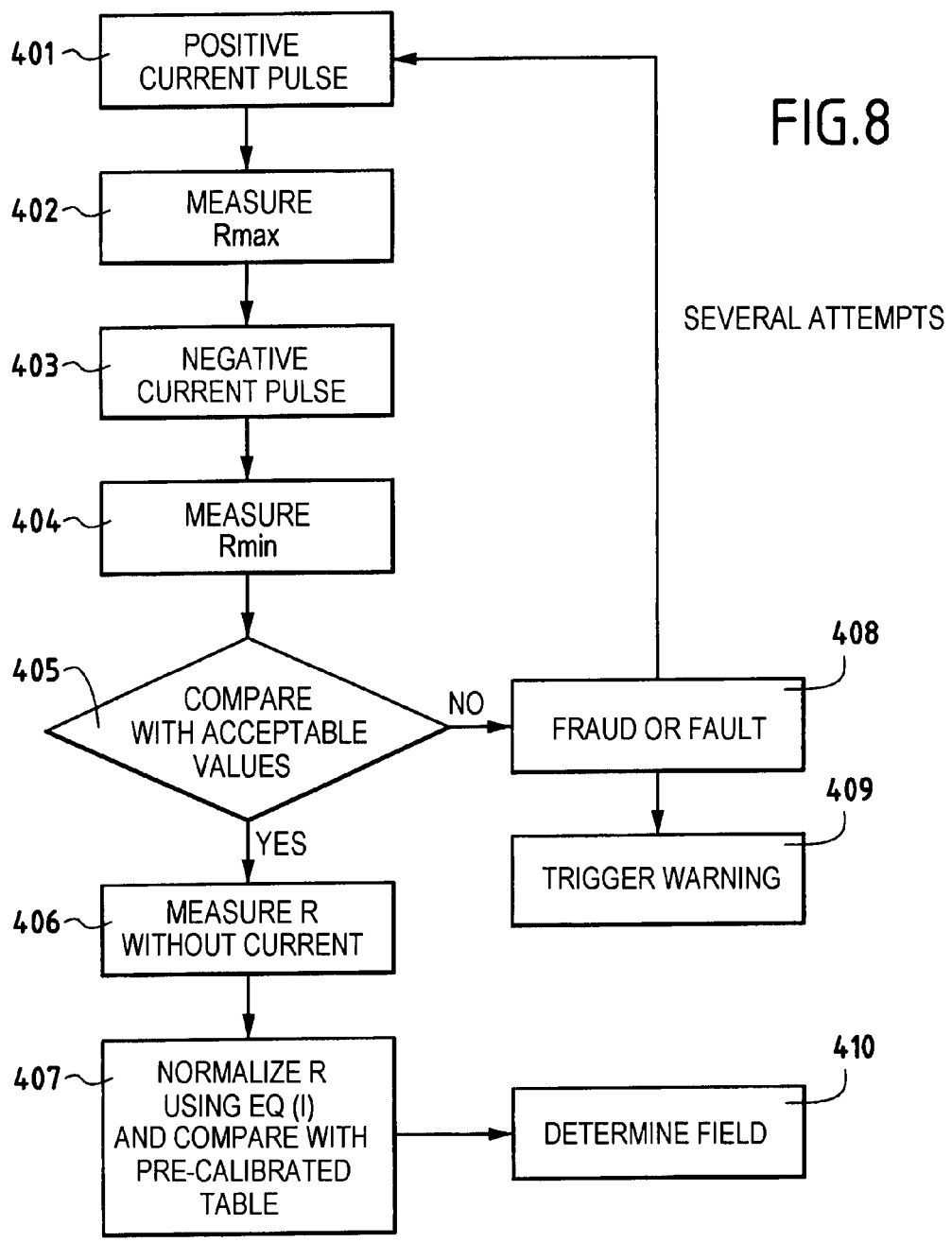

METHOD AND APPARATUS FOR MAGNETIC FIELD MEASUREMENTS USING A MAGNETORESISTIVE SENSOR

This application is a §371 national phase filing of PCT/EP2005/055304 filed Oct. 17, 2005, and claims priority to French application No. 04 10988 filed Oct. 18, 2004.

The present invention relates to a method and to an apparatus for measuring the value of an external magnetic field using a magnetoresistive sensor.

Various types of magnetoresistive sensor are presently known that comprise a magnetoresistance based on the effects of electron spin. Under all circumstances, the electrical resistance of the material constituting the magnetoresistance is modified in the presence of a magnetic field.

Known magnetoresistances comprise in particular: anisotropic magnetoresistance (AMR); giant magnetoresistance (GMR); tunnel magnetoresistance (TMR); and colossal magnetoresistance (CMR).

At present, giant magnetoresistances are used mainly in read heads.

Tunnel magnetoresistances, of more recent design, are intended in particular to serve as building blocks for magnetic random access memories (MRAM).

Magnetoresistance sensors can be used in particular for measuring the magnetic field created by permanent magnets, as in the context of magnetic encoding applications, for example. Magnetoresistive sensors can also be used for measuring a weak magnetic field such as the Earth's magnetic field, or for measuring a magnetic field created by a current so as to be able to deduce a measurement of the current therefrom.

The reliability and the accuracy of measurements performed by magnetoresistive elements are nevertheless penalized by drift due to temperature (where such drift is reversible), or to other causes such as aging or irradiation (where such drift can then be irreversible). Furthermore, as a result of manufacture, magnetoresistive elements can present dispersion in their characteristics.

A magnetoresistive element of GMR, TMR, or CMR type presents a resistance R that varies as a function of the applied magnetic field over a range of 5% to 10% R for GMR, 25% to 50% R for TMR, and can reach several hundreds of percent with CMR.

Magnetoresistive elements such as GMR, TMR, or CMR elements present thermal drift in resistance that can be compensated to some extent by using a bridge circuit with two or more similar elements.

Nevertheless, such elements present drift in their magnetic field sensitivity coefficient due to the finite value of the Curie temperature of the magnetic materials included in such elements. This drift cannot be compensated merely by using a circuit with a plurality of elements.

Proposals have already been made to make the sensor operate always at the same point by applying negative feedback so as to compensate the above-mentioned effect of drift in the magnetic field sensitivity coefficient. However that technique on its own does not solve all problems, and it involves a high level of consumption due to the electricity that needs to be applied for the negative feedback.

Proposals have also been made to compensate sensitivity drift using electronic circuits that include a component that is temperature dependent. Such a technique is difficult to put into practice due to the variability of sensitivities that result from sensor manufacture. It requires a plurality of calibration points as a function of temperature.

Even when sensitivity drift can be considered as small, circumstances can arise where magnetoresistances present hysteresis, for example, and that can disturb the quality of measurements taken.

The present invention seeks to remedy the above-mentioned drawbacks and to make it possible in particular to take magnetic field measurements that are more accurate and more reliable when using magnetoresistive sensors.

The invention seeks in particular to correct systematically and accurately any drift in the sensitivity of sensors of the magnetoresistive type.

The invention also seeks to provide a simple way of providing correction that makes it possible to take no account of the history of a magnetoresistance element, and thus to avoid the drawbacks associated with any hysteresis.

The invention is also compatible with known signal-processing and bridge-circuit techniques, for example.

The above-mentioned objects are achieved by a method of measuring the value of an external magnetic field by using a magnetoresistive sensor, the method being characterized in that it comprises a first step consisting in applying in situ, prior to each measurement of the external magnetic field, at least one additional magnetic field pulse in the space containing the magnetoresistive sensor, which additional magnetic field pulse presents a first value having a first polarity that is positive or negative and a magnitude that is sufficient to saturate the sensor, and a second step consisting in applying a predetermined value to said additional magnetic field that does not saturate the sensor, and in determining the value of the external magnetic field by measuring the resistance of the magnetoresistive sensor.

Preferably said predetermined value is equal to zero.

The above-defined method serves in particular to avoid all of the drawbacks associated with any hysteresis of the magnetoresistive sensor.

In order to correct in systemic and accurate manner any sensor sensitivity drift, the method may be more particularly characterized in that the first step performed in situ prior to each measurement of the external magnetic field comprises a first substep consisting in applying a first additional magnetic field pulse presenting a first value having positive polarity and magnitude sufficient to saturate the sensor, and in measuring the maximum value at high saturation ($R_{max}$) of the resistance of the sensor, and a second substep consisting in applying a second additional magnetic field pulse presenting a second value having negative polarity and magnitude sufficient to saturate the sensor, and in measuring the minimum value at low saturation ($R_{min}$) of the resistance of the sensor, and in that during the second step, a predetermined value of said additional magnetic field is applied that does not saturate the sensor, the effective resistance ($R_{eff}$) of the magnetoresistive sensor is measured, and the effective resistance measurement ($R_{eff}$) is autocalibrated using the high saturation maximum value ($R_{max}$) and the low saturation minimum value ($R_{min}$) as previously measured in order to determine a corrected resistance ($R_{cor}$) from which the value of the external magnetic field is determined.

The first substep may be performed chronologically before the second substep, or vice versa.

The predetermined value of the additional magnetic field that does not saturate the saturate is preferably equal to zero.

In a particular embodiment, the corrected resistance ($R_{cor}$) is obtained from the following formula:

$$R_{cor} = \frac{(R_{\mathit{eff}} - R_{min})}{(R_{max} - R_{min})}(R_{\mathit{ref\ max}} - R_{\mathit{ref\ min}}) + R_{\mathit{ref\ min}}$$

where $R_{\mathit{ref\ max}}$ and $R_{\mathit{ref\ min}}$ are respectively the maximum reference value at high saturation for the resistance at a given temperature selected for calibrating the sensor, and the minimum reference value at low saturation for the resistance at said calibration temperature.

The additional magnetic field pulse may be created by an induction coil situated in the vicinity of the magnetoresistive sensor.

In another possible implementation, the additional magnetic field pulse is created by a conductive sheet fed with current and situated in the vicinity of the magnetoresistive sensor.

In a particular implementation, the method further comprises a preliminary precalibration step with calibration values being recorded in a calibration table, and during the second step, the corrected resistance value ($R_{cor}$) is determined by comparing the value of the resistance as actually measured ($R_{\mathit{eff}}$) with the calibration values stored in the calibration table.

Preferably, the preliminary precalibration step is repeated periodically.

In another possible implementation of the method of the invention, the external magnetic field is measured by negative feedback consisting in applying an additional magnetic field in the second step such that the resistance R of the magnetoresistive sensor is taken to a predetermined value that is intermediate between the extreme values $R_{min}$ and $R_{max}$ of the resistance of the magnetoresistive sensor as determined during the first step.

The method of the invention may also comprise a comparison step in which the minimum value at low saturation $R_{min}$ and the maximum value at high saturation $R_{max}$ for the resistance of the magnetoresistive sensor as determined during the first step are compared with predetermined acceptable values, and a step of triggering a warning in the event of a mismatch being detected relative to said predetermined acceptable values.

The invention also provides magnetic field apparatus using a magnetoresistive sensor, the apparatus being characterized in that it comprises at least one magnetoresistive sensor, measurement means for measuring the resistance of said magnetoresistive sensor, generator means for generating an additional magnetic field in the space containing the magnetoresistive sensor, and control means firstly for selectively controlling said generator means to apply an additional magnetic field pulse presenting a first value having a first polarity that is positive or negative and magnitude that is sufficient for saturating the magnetoresistive sensor, and secondly for selectively controlling measurement of the resistance of the magnetoresistive sensor by said measurement means.

The apparatus may further comprise storage means for storing calibration values for the resistance of the magnetoresistive sensor.

The magnetoresistive sensor may comprise at least one magnetoresistance of at least one of the following types: an anisotropic magnetoresistance (AMR); a giant magnetoresistance (GMR); a tunnel magnetoresistance (TMR); and a colossal magnetoresistance (CMR).

The apparatus may further comprise verifier means for verifying the acceptability of the values of the additional magnetic field pulse as applied by said generator means, and warning means that respond to said verifier means.

In a particular embodiment, the measurement means for measuring the resistance of the magnetoresistive sensor comprise means for measuring the current needed to bring the measured resistance of the magnetoresistive sensor to a reference value $R_{\mathit{ref}}$ lying between extreme values $R_{min}$ and $R_{max}$ of the magnetoresistance of the magnetoresistive sensor as measured while said generator means for generating an additional magnetic field pulse are activated, said reference value $R_{\mathit{ref}}$ being a linear combination of said extreme values $R_{min}$ and $R_{max}$.

According to a particular embodiment, the apparatus comprises a processing device for use in situ prior to each measurement of the external magnetic field, said first processing device comprising a generating means for applying a first additional magnetic field pulse presenting a first value having positive polarity and magnitude sufficient to saturate the sensor, and measurement means for measuring the maximum value at high saturation $R_{max}$ of the resistance of the sensor, a generating means for applying a second additional magnetic field pulse presenting a second value having negative polarity and magnitude sufficient to saturate the sensor, and measurement means for measuring the minimum value at low saturation $R_{min}$ of the resistance of the sensor, and a processing device comprising means for applying a predetermined value of said additional magnetic field that does not saturate the sensor, measurement means for measuring the effective resistance $R_{\mathit{eff}}$ of the magnetoresistive sensor, and calibrating means for autocalibrating the effective resistance measurement $R_{\mathit{eff}}$ using the high saturation maximum value $R_{max}$ and the low saturation minimum value $R_{min}$ as previously measured in order to determine a corrected resistance $R_{cor}$ from which the value of the external magnetic field is determined.

Other characteristics and advantages of the invention appear from the following description of particular embodiments, given as examples and with reference to the accompanying drawings, in which:

FIG. 1 is a diagrammatic section view showing the elements making up a GMR type magnetoresistive sensor, by way of example;

FIG. 2 is a graph showing a typical response curve for a GMR type sensor, such as the sensor shown in FIG. 1, by way of example;

FIG. 8 is a flow chart showing an example of a measurement diagram enabling the value of an external magnetic field to be determined in accordance with a particular implementation of the invention that makes use of a calibration table;

Figure 3:
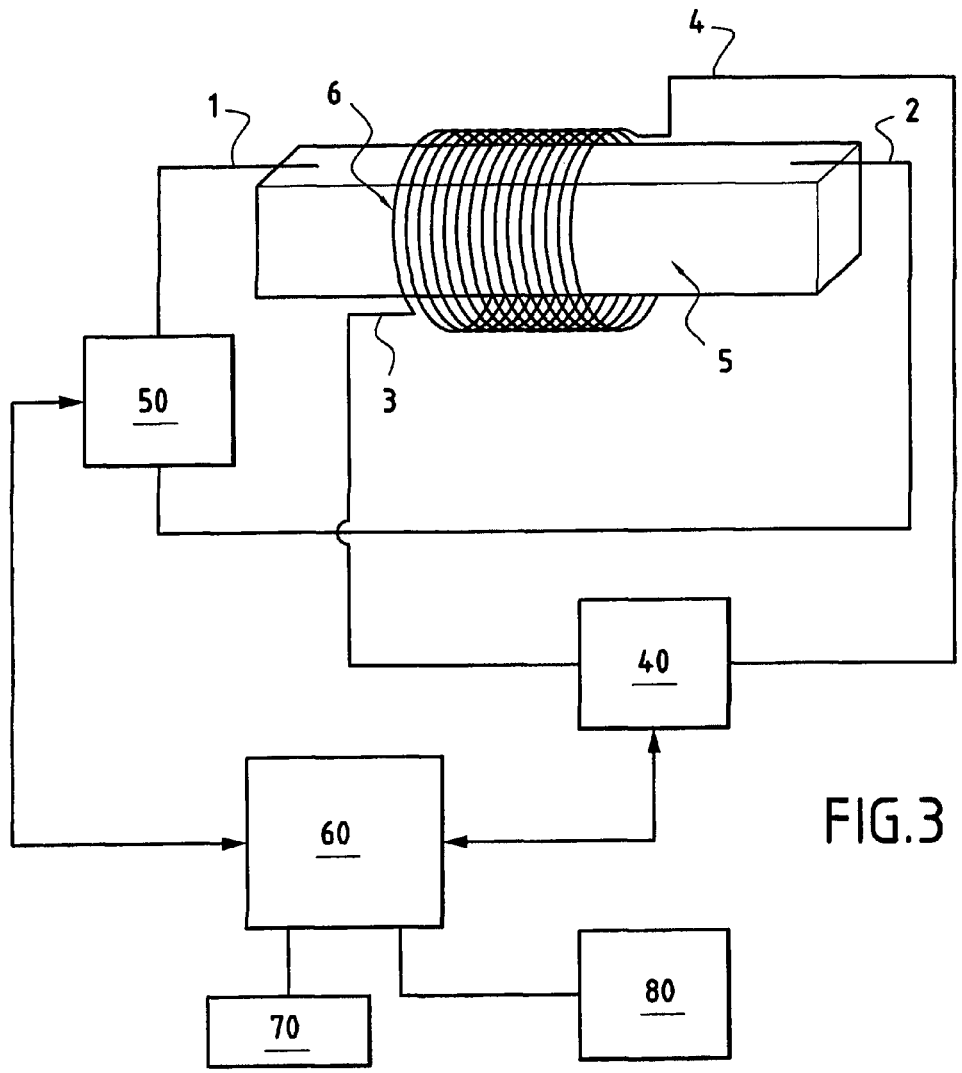
FIG. 3 is a diagrammatic view of a first possible embodiment of a measurement device for measuring the value of a magnetic field in accordance with the invention that makes use of an induction coil.

The method and the apparatus of the invention are adapted to implementing magnetoresistive sensors making use in particular of an anisotropic magnetoresistance (AMR), a giant magnetoresistance (GMR), a tunnel magnetoresistance (TMR), or a colossal magnetoresistance (CMR).

The invention applies particularly well to a giant magnetoresistance having a resistive element of the spin valve type.

FIG. 1 shows an example of a magnetoresistive sensor 10 of the GMR type having spin valve structure.

A spin valve typically contains a hard or blocked layer 22, i.e. a layer that presents little sensitivity to the external magnetic field, and a soft or free layer 21 that is highly sensitive to the magnetic field.

The hard layer 22 may be constituted either by an assembly of ferromagnetic layers presenting high coercivity, or by a mixture of optionally artificial antiferromagnetic layers coupled with a ferromagnetic layer.

The soft layer is formed by magnetic materials that are very soft.

Starting from its free surface, the magnetoresistive sensor 10 of FIG. 1 may, for example, comprise a protective layer 11 made of tantalum, and a soft magnetic layer 21 comprising a layer 12 of NiFe and a layer 13 of CoFe. The soft layer 21 becomes oriented in the direction of the external magnetic field.

A hard magnetic layer 22 is separated from the soft magnetic layer 21 by a separator layer 14 made of copper. Starting from the separator layer 14, the hard magnetic layer 22 may comprise a layer 15 made of CoFe and a layer 16 made of IrMn. The hard layer 22 possesses a direction of magnetization that is set during manufacture. A tantalum layer 17 may serve as a precursor for growing upper layers that are added to implement the circuit.

FIG. 2 shows the typical response curve of a GMR type sensor which, like all magnetoresistive elements, presents a curve of typical shape when measuring resistance as a function of magnetic field.

One such curve as shown in FIG. 2 presents a negative saturation level a1, progressive desaturation that causes its resistance to increase in non-linear manner (segment a2), followed by a portion that is quasi-linear (segment c1), followed by another non-linear portion (segment b2), prior to reaching a high saturation level (segment b1).

Under the effect of various kinds of drift, three values vary: the resistance of the low saturation level a1, the slope in the quasi-linear region c1 (which corresponds to sensitivity), and the resistance of the high saturation level b1.

When a GMR is subjected to a magnetic field H, the way in which its resistance varies, R=f(H), presents the typical appearance of the curve shown in FIG. 2. It goes from a low saturation value $R_{min}$ corresponding to the two layers 21 and 22 being magnetized in parallel, to a high saturation value $R_{max}$ corresponding to the magnetization in the two layers being in anti-parallel alignment.

A remarkable property of this type of sensor is the way in which response varies proportional with varying temperature.

The inventors have found that over a large temperature range, typically −200° C. to +200° C., all the curves R=f(H) are reproducible, providing the high and low resistance values are normalized.

With reference to FIG. 2, this amounts to saying that the width of the working zone C can be assumed to be constant, and that the sensitivity is then the result of the difference between the low saturation value $R_{min}$ that can be located in a measurement zone A, and a high saturation value $R_{max}$ that can be located in a measurement zone B.

The method of the invention makes use of this property for automatically calibrating the magnetic field measurements on the basis of the extreme values $R_{min}$ and $R_{max}$.

Taking a measurement of the external field then essentially comprises taking three independent measurements: a measurement of the low resistance ($R_{min}$); a measurement of the high resistance ($R_{max}$); and a measurement of the effective resistance ($R_{eff}$).

The high and low resistance measurements are performed by applying positive or negative magnetic field pulses to the GMR. These pulses must be sufficiently intense to saturate the sensor.

The high and low resistance values can be measured in any chronological order. Nevertheless, if the material used presents hysteresis, it is necessary when taking a measurement to know its immediately preceding state.

The working zone C is initially selected on the basis of a criterion of the sensor presenting sensitivity in this zone that is sufficient, i.e. such that its sensitivity is not less than x% of the maximum sensitivity of the sensor. Preferably, x% can be about 70%. If the width of the magnetic field axis in the working zone C is written dHc, then the saturation zones are defined as follows for each type of component: the zones A and B are defined by the accuracy desired for the measurement, as defined below.

The high measurement point (zone B) corresponds to a magnetic field such that the measured resistance lies in the range:

$$R_{max} - (R_{max} - R_{min})/(R_{min} + R_{max})*u \text{ to } R_{max}$$

and the value of the low measurement point (zone A) corresponds to a magnetic field such that the measured resistance lies in the range:

$$R_{min} \text{ to } R_{min} + (R_{max} - R_{min})/(R_{min} + R_{max})*u$$

The value of u gives the desired accuracy, with u equal to about 0.01 giving measurement accuracy of 1%.

The difference between zone A and zone C or between zone B and zone C must be sufficient to avoid overlap when applying extreme magnetic fields to the working zone, which implies a magnetic field difference between zone A and zone C or between zone B and zone C that is not less than dHc/2.

The corrected value $R_{cor}$ for the resistance to compensate for the effects of variations is obtained using the following formula:

$$R_{cor} = \frac{(R_{eff} - R_{min})}{(R_{max} - R_{min})}(R_{ref\ max} - R_{ref\ min}) + R_{ref\ min} \qquad (I)$$

where $R_{ref\ max}$ and $R_{ref\ min}$ are values obtained at a given temperature which is selected for calibrating the sensor.

Starting from $R_{cor}$, the value of the external magnetic field can be determined using the usual formulae.

FIG. 3 shows a first embodiment of apparatus for implementing the invention.

A magnetoresistive sensor 5 in the form of a bar is connected via connection elements 1 and 2 placed at its ends to a device 50 for measuring the resistance of the sensor 5.

The magnetoresistive sensor is placed in an induction coil 6 whose ends 3 and 4 are connected to a current generator 40 suitable for delivering pulses at various currents. The induction coil 6 associated with the current generator 40 constitutes a generator of additional magnetic field pulses serving to apply selectively to the magnetoresistive sensor 5 a magnetic field that is proportional to the current carried by the coil 6. The coefficient of proportionality depends on the geometry of the coil 6 and may be calculated from conventional formulae for electromagnetism.

The current generator 40 and the device 50 for measuring the resistance of the magnetoresistive sensor 5 are connected to a control and processor circuit 60 which can be associated with memory circuits 70 and an output device 80.

The control and processor circuit 60 serves to control the current generator 40 selectively, in particular for the purpose of measuring the extreme resistance values $R_{min}$ and $R_{max}$ as defined above. The control and processor circuit 60 also serves to control the resistance measuring device 50 selectively for the purpose of measuring the values $R_{min}$ and $R_{max}$ when the current generator 40 is activated and for measuring a resistance R within the working zone when the current generator 40 is not activated.

It is also possible, in a preliminary calibration step, to establish and store in the memory 70 the curve plotting resistance as a function of magnetic field for the magnetoresistive sensor 5 at a given temperature. The value of the magnetoresistance of the sensor 5 can be obtained for different magnetic fields in the measurement range by using the current generator 40, which is also used for sending positive and negative magnetic field pulses via the coil 6 when obtaining the high and low saturation levels. During an operation of establishing the curve for resistance values for the sensor 5, the current generator 40 serves merely to deliver predefined known current values through the induction coil 6.

The preliminary calibration step can subsequently be repeated on a regular basis in order to take account of the sensor 5 aging.

Where appropriate, the magnetoresistive sensor 5 may be made up of a plurality of elements connected in a half-bridge or in a full bridge without that modifying the essence of the measurement method.

Figure 4:
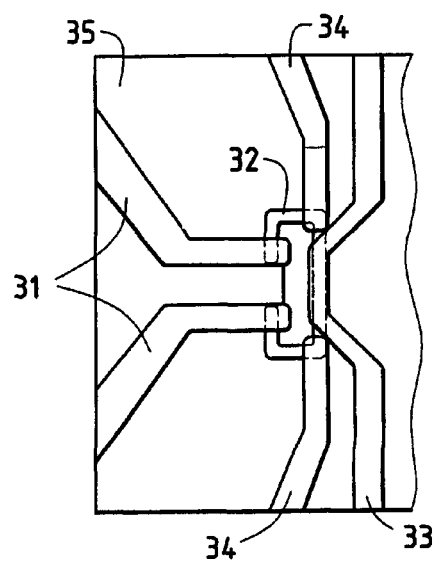
FIG. 4 is a diagrammatic view of a second possible embodiment of a device for measuring the value of a magnetic field in accordance with the invention that makes use of an integrated magnetoresistive sensor.

FIG. 4 shows another embodiment in which there can be seen a magnetoresistive sensor 32 made in integrated form and having the shape of an almost-closed letter C. Conductor tracks 31 serve to feed current and conductor tracks 34 serve to measure the voltage and thus the resistance of the magnetoresistive sensor 32 using a resistance measuring device such as the device 50 shown in FIG. 3.

A metal line 33, e.g. made of Ti/Au or of copper constitutes a current sheet which is deposited on the magnetoresistive element 32 with an intermediate insulating layer being interposed (not shown in FIG. 4). FIG. 4 shows a current sheet 33 integrated on the substrate 35 of the sensor 32 itself. Nevertheless, it is also possible for the current sheet 33 to be independent of the sensor 32 and for it merely to be placed in the vicinity thereof. The current sheet 33 is connected to a current generator such as the generator 40 of FIG. 3. The elements 60, 70, and 80 of FIG. 3 are also present in the embodiment of FIG. 4, but they are not shown in the drawing.

In the embodiment of FIG. 4, and in similar manner to the embodiment shown in FIG. 3, the magnetic field created on the sensor 32 by the current generator 60 by means of the current sheet 33 is proportional to the current I being carried by said current sheet 33.

If the distance between the magnetoresistive sensor 32 and the current sheet 33 is written d, then the magnetic field that is created is given by $\alpha I/2d$ where $\alpha$ is of the order of unity and is calculated by integrating current lines.

Thus, for a distance d of 100 nanometers (nm), and a sensor width w of 5 micrometers ($\mu$m), it is necessary to pass a current of 50 milliamps (mA) in order to create the 5 milliteslas (mT) needed for saturating the magnetoresistance. The thickness of the current sheet 3 has a second order effect and may lie in the range 50 nm to a few micrometers.

The conductive sheet 33 described above is fed with current and placed on or under the magnetoresistive sensor 32 in an integrated method with an intermediate layer of insulating material being interposed therebetween. In a variant embodiment, the current-fed conductive sheet 33 may be situated on the opposite face of the substrate 35 carrying the magnetoresistive sensor 32.

Figure 5:
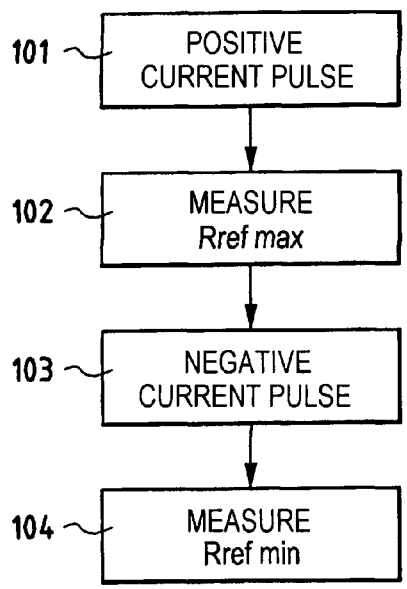
FIG. 5 is a flow chart showing an example of a calibration process that can be implemented in the context of the method of the present invention.

FIG. 5 summarizes the calibration step that enables the values $R_{ref\,max}$ and $R_{ref\,min}$ to be determined, which values correspond to a temperature that is the same but not necessarily known, and these values are used in above-mentioned equation (I) to calculate the corrected resistance value $R_{cor}$ from which the effects of variation have been removed.

Step 101 corresponds to sending a positive current pulse from the current generator 40 through the coil 6 (FIG. 3) or the current sheet 33 (FIG. 4).

Step 102 corresponds to measuring the value $R_{ref\,max}$ using the device 50 during the application of the positive current pulse.

Step 103 corresponds subsequently to sending a negative current pulse from the current generator 40 through the coil 6 (FIG. 3) or the current sheet 33 (FIG. 4).

Step 104 corresponds to measuring the value $R_{ref\,min}$ using the device 50 while the negative current pulse is being applied.

Figure 6:
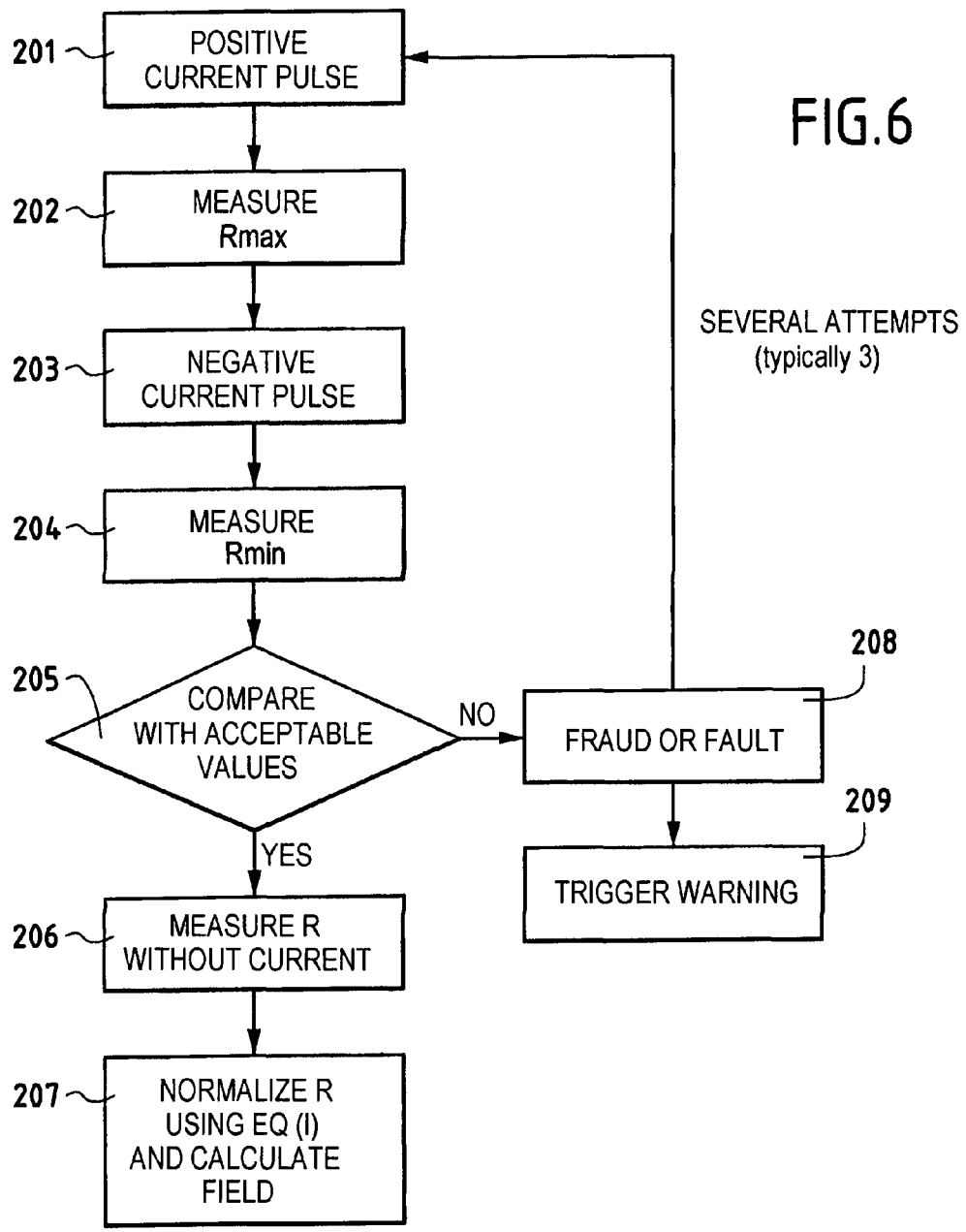
FIG. 6 is a flow chart showing an example of a measurement diagram enabling the value of an external magnetic field to be determined in an implementation of the invention, without making use of a calibration table.

FIG. 6 summarizes the main steps in the measurement method of the invention for determining the value of the external magnetic field by proceeding initially with applying an additional magnetic field pulse saturating the space containing the magnetoresistive sensor, then returning the additional magnetic field to zero, and determining the value of the external magnetic field by measuring the value of the resistance of the magnetoresistive sensor.

In the method shown in FIG. 6, no comparison is made with a calibration table.

In a step 201, a positive current pulse is applied by the current generator 40 to the member for creating an additional magnetic field pulse (coil 6 or current sheet 33) so as to saturate the magnetoresistive sensor at its maximum resistance value.

In a step 202, the maximum resistance at high saturation ($R_{max}$) of the sensor is measured using the resistance-measuring device 50.

In a step 203, a negative current pulse is applied by the current generator 40 to the member for creating an additional magnetic field pulse (coil 6 or current sheet 33) so as to saturate the magnetoresistive sensor at its minimum resistance value.

In a step 204, the minimum resistance at low saturation ($R_{min}$) of the sensor is measured using the resistance-measuring device 50.

Step 205 consists in a step of making a comparison with acceptable values.

It should be observed that the method of the invention operates insofar as the magnetic field that is to be measured lies within the operating range of the magnetoresistive sensor.

When an applied external field is strong enough to saturate the magnetoresistance, the magnetic field pulses no longer enable $R_{min}$ and $R_{max}$ to be measured. That is why it is necessary to incorporate in the method the step 205 of verifying that the measurements are valid.

One way of performing this verification consists in setting a minimum value for the ratio $(R_{max}-R_{min})/(R_{max}+R_{min})$, for example.

Another possibility consists in setting acceptable ranges for $R_{min}$ and $R_{max}$, given knowledge of the temperature range of the magnetoresistance.

These verifications make it possible to ensure that the magnetoresistance is operated properly and that there are no strong magnetic fields as might be created by other portions of an entire system malfunctioning, or by undesired application of an additional magnetic field.

If the test 205 shows that the values determined for $R_{max}$ and $R_{min}$ do not correspond to acceptable values, then the method moves onto a fraud or false detection step 208 and loops back to the input of step 201 in order to attempt to determine new values for $R_{min}$ and $R_{max}$.

If after several attempts, typically three attempts, the test 205 shows that the values $R_{max}$ and $R_{min}$ still do not correspond to acceptable values, then fraud detection step 208 triggers a warning in a step 209.

If the test 205 shows that the values determined for $R_{max}$ and $R_{min}$ correspond to acceptable values, then the method onto a step 206 in which the effective value of the resistance $R_{eff}$ is measured using the measurement device 50, while the current generator 40 is inactive and is not delivering current to the element for generating an additional magnetic field.

Step 207 corresponds to normalizing the previously measured value R. During this step 207, the value $R_{cor}$ is calculated to give the resistance corrected for the effects of variation, and then the value of the external magnetic field is determined on the basis of this value $R_{cor}$.

It is possible to calibrate measurement apparatus of the invention using only two measurement points, with such calibration being performed when the apparatus fitted with a magnetoresistive sensor is first put into operation.

Nevertheless, the presence of the additional magnetic field generator (current generator 40 and coil 6 or current sheet 33) makes it possible, if so desired, to perform fine precalibration of the sensor by making a calibration table. This operation must be performed in the absence of an external magnetic field, with only the additional magnetic field being used for the calibration operation.

The current generator 40 is then used to generate a current ramp so as to create a magnetic field ramp. The resistance of the magnetoresistive sensor is then measured with the measurement device 50 for each current value and a table is drawn up. This makes it possible to obtain a response curve for the magnetoresistance as a function of the magnetic field.

While measuring an external magnetic field, the tabulated curve for the value of the resistance R as a function of the magnetic field serves as a reference after an affine correction due to temperature variations. The term affine correction is used to mean that the effective value of the resistance R is weighted by a sensitivity coefficient depending on temperature and is offset by an amount corresponding to the change in the mean resistance value.

This precalibration step can be performed automatically, on a regular basis, thereby compensating for aging of the GMR.

Periodicity of the order of once a month is compatible with use at around ambient temperature. If the sensor is subjected to large temperature cycles, exceeding 140° C., then shorter periodicity needs to be envisaged.

The precalibration step serves in particular to correct for non-linearities in the magnetoresistance response.

Figure 7:
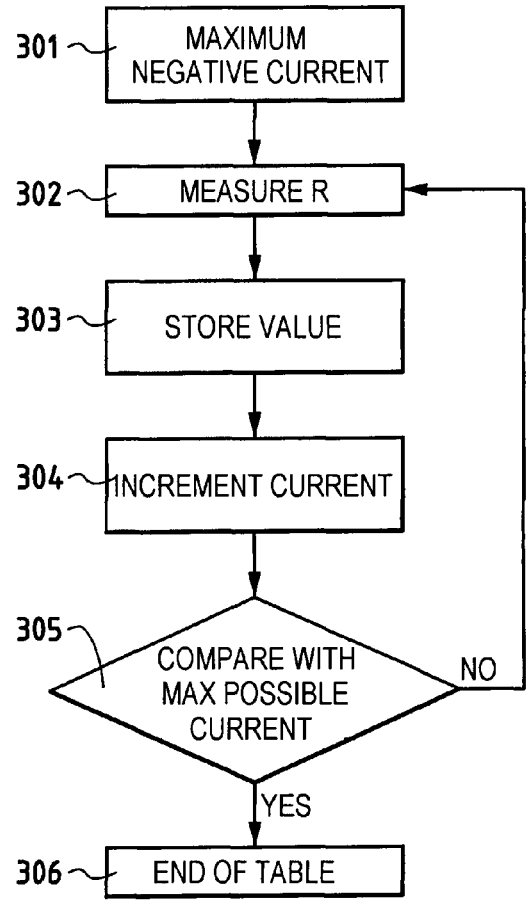
FIG. 7 is a flow chart showing how a calibration table can be determined in the context of a particular implementation of the method of the invention.

FIG. 7 summarizes the process for determining a calibration table.

In step 301, a negative current of maximum magnitude is applied using the current generator 40.

In step 302, the value of the resistance R of the magnetoresistive sensor is measured under such conditions using the measurement device 40, then in step 303 the measured resistance value is stored as a function of the magnitude of the applied current.

In step 304, a current increment is applied via the current generator 40.

A test 305 serves to determine whether the incremented current is equal to the maximum positive current. If not, the process returns to step 302 and measures the resistance value R again. Otherwise, if the response to test 305 is positive, then the process moves onto step 306 in which the calibration table is finished.

FIG. 8 is a flow chart corresponding to determining the value of an external magnetic field in accordance with the invention using a method which is essentially similar to that shown in FIG. 6, but which also implements a comparison with a calibration table as set up in the manner described above.

Steps 401 to 406 and 408 & 409 of the FIG. 8 flow chart are analogous respectively to steps 201 to 206 and 208 & 209 of the flow chart of FIG. 6, and they are not described again.

In contrast, in FIG. 8, after step 406 in which the value of the resistance R is measured in the absence of an additional magnetic field, step 407 comprises normalizing the value of the resistance R in order to determine a corrected value $R_{cor}$ in application of above-mentioned equation (I), after which, a comparison is performed between the values of $R_{cor}$ and the values recorded in a precalibrated table in order to determine, in step 410, the measured external magnetic field.

Figure 9:
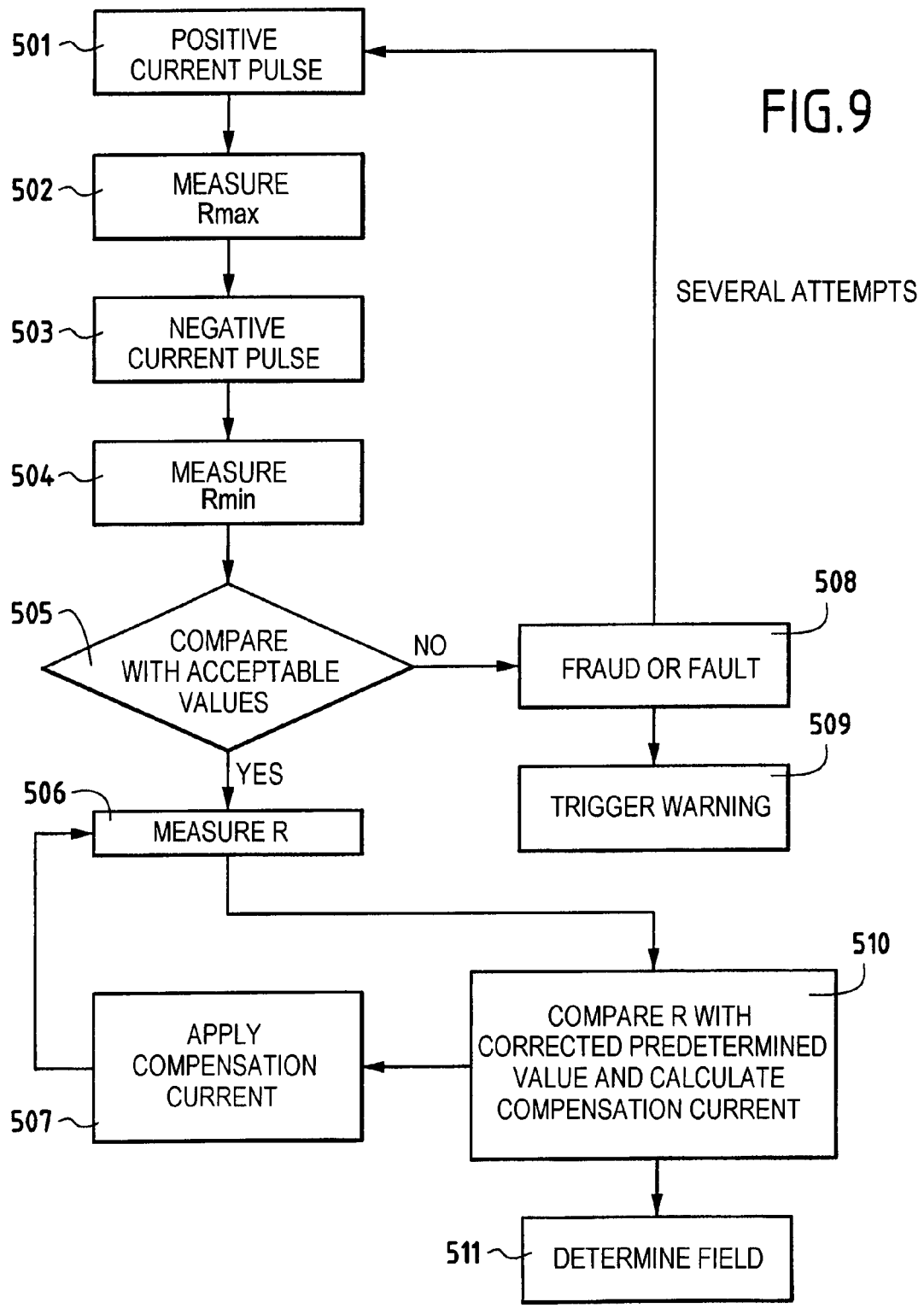
FIG. 9 is a flow chart showing another example of an implementation of the method of the invention, in which negative feedback is used.

FIG. 9 shows a variant of the measurement method of the invention in which a calibration method by measuring extreme values is associated with measuring the applied magnetic field by negative feedback.

Steps 501 to 505 and 508 & 509 of the flow chart of FIG. 9 are similar to steps 201 to 205 and 208 & 209 respectively of the flow chart of FIG. 6, and they are not described again.

In the method shown in FIG. 9, when the extreme values for the sensor resistance $R_{max}$ and $R_{min}$ have been measured using a positive magnetic field pulse and a negative magnetic field pulse, and have been found acceptable in test 505, the method moves on to step 506 of measuring the effective resistance value. This is compared in step 510 with a predetermined intermediate reference value, e.g. the value:

$$R_{ref}=(R_{min}+R_{max})/2$$

Then, in step 507, a nominal compensation current is applied by the current generator 40 to the element for applying an additional magnetic field (coil 6 or current sheet 33) in order to bring the measured resistance R to said predetermined intermediate value $R_{ref}$.

Step 506 is repeated until in step 510 the difference between the measured value and the predetermined intermediate value is less than a desired measurement error. Step 511 resulting from the comparison step 510 corresponds to determining the magnetic field that is to be measured.

The variant described in FIG. 9 implies greater electricity consumption and a longer response time, but it provides excellent compensation for temperature drift.

Figure 10:
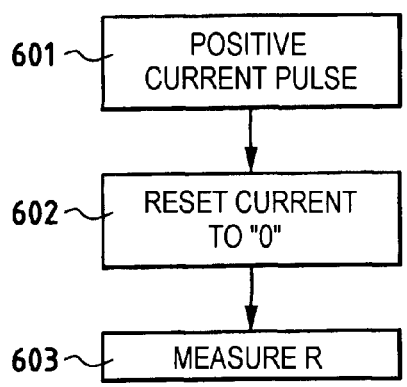
FIG. 10 is a flow chart showing the steps implemented in the method of the invention making it unnecessary to take account of the history of the magnetoresistive sensor used.

FIG. 10 shows an application of the method of the invention to magnetoresistances presenting hysteresis.

In a first step 601, an additional magnetic field pulse is applied using the current generator 40, said pulse being, for example, positive, but it could equally well be negative.

Step 602 corresponds to returning the current delivered by the current generator 40.

Step 603 corresponds to measuring the value of the resistance R of the magnetoresistive sensor using the measurement device 50.

The preliminary magnetic field pulses applied during step 601 serves to set the magnetic history of a magnetoresistance prior to proceeding with step 603 of measuring an external magnetic field.

The invention claimed is:

1. A method of measuring the value of an external magnetic field by using a magnetoresistive sensor, the method being characterized in that it comprises:
   a first step consisting in applying, in situ, prior to each measurement of the external magnetic field, at least one additional magnetic field pulse in the space containing the magnetoresistive sensor,
   said first step itself comprising a first substep consisting in applying a first additional magnetic field pulse presenting a first value of positive polarity and of magnitude sufficient for saturating the sensor, and in measuring the maximum value at high saturation ($R_{max}$) of the resistance of the sensor, and a second substep consisting in applying a second additional magnetic field pulse presenting a second value having negative polarity and magnitude sufficient for saturating the sensor, and in measuring the minimum value at low saturation ($R_{min}$) of the resistance of the sensor; and
   a second step during which a predetermined value of said additional magnetic field is applied that does not saturate the sensor, and in which the effective resistance ($R_{eff}$) of the magnetoresistive sensor is measured and the measurement of the effective resistance ($R_{eff}$) is automatically calibrated using the maximum and minimum values at high and low saturation ($R_{max}, R_{min}$) as previously measured in order to determine a corrected resistance value ($R_{cor}$) from which the value of the external magnetic field is determined.

2. A method according to claim 1, characterized in that the first substep is performed chronologically prior to the second substep.

3. A method according to claim 1, characterized in that the second substep is performed chronologically prior to the first substep.

4. A method according to claim 1, characterized in said predetermined value is equal to zero.

5. A method according to claim 4, characterized in that the corrected resistance value ($R_{cor}$) is obtained from the following formula:

$$R_{cor} = \frac{(R_{eff} - R_{min})}{(R_{max} - R_{min})}(R_{ref\ max} - R_{ref\ min}) + R_{ref\ min}$$

in which $R_{refmax}$ and $R_{refmin}$ are respectively the maximum reference resistance at high saturation at a given temperature selected for calibrating the sensor, and the minimum reference resistance at low saturation at said calibration temperature.

6. A method according to claim 1, characterized in that the additional magnetic field pulse is created by an induction coil situated in the vicinity of the magnetoresistive sensor.

7. A method according to claim 1, characterized in that the additional magnetic field pulse is created by a conductive sheet fed with current and situated in the vicinity of the magnetoresistive sensor.

8. A method according to claim 4, characterized in that it further comprises a preliminary precalibration step with calibration values being recorded in a calibration table, and in that during the second step, the corrected resistance value ($R_{cor}$) is determined by comparison of the resistance value as actually measured ($R_{eff}$) with the calibration values stored in the calibration table.

9. A method according to claim 8, characterized in that the preliminary precalibration step is repeated periodically.

10. A method according to claim 1, characterized in that the external magnetic field is measured by negative feedback consisting in applying an additional magnetic field during the second step such that the resistance R of the magnetoresistive sensor is taken to a predetermined value that is intermediate between the extreme resistance values $R_{min}$ and $R_{max}$ of the magnetoresistive sensor as determined during the first step.

11. A method according to claim 1, characterized in that it further comprises a step of comparing the minimum resistance at low saturation $R_{min}$ and the maximum resistance at high saturation $R_{max}$ of the magnetoresistive sensor as determined during the first step with predetermined acceptable values, and a step of triggering a warning in the event of detecting a mismatch with said predetermined acceptable values.

12. A method according to claim 1, characterized in that the magnetoresistive sensor comprises at least one magnetoresistance of at least one of the following types: anisotropic magnetoresistance (AMR); giant magnetoresistance (GMR); tunnel magnetoresistance (TMR); and colossal magnetoresistance (CMR).

13. A method according to claim 5, characterized in that:
   the additional magnetic field pulse is created by an induction coil situated in the vicinity of the magnetoresistive sensor;
   the additional magnetic field pulse is created by a conductive sheet fed with current and situated in the vicinity of the magnetoresistive sensor;
   it further comprises a preliminary precalibration step with calibration values being recorded in a calibration table, and in that during the second step, the corrected resistance value ($R_{cor}$) is determined by comparison of the resistance value as actually measured ($R_{eff}$) with the calibration values stored in the calibration table;
   the preliminary precalibration step is repeated periodically;
   the external magnetic field is measured by negative feedback consisting in applying an additional magnetic field during the second step such that the resistance R of the magnetoresistive sensor is taken to a predetermined value that is intermediate between the extreme resistance values $R_{min}$ and $R_{max}$ of the magnetoresistive sensor as determined during the first step;
   it further comprises a step of comparing the minimum resistance at low saturation $R_{min}$ and the maximum resistance at high saturation $R_{max}$ of the magnetoresistive sensor as determined during the first step with predetermined acceptable values, and a step of triggering a warning in the event of detecting a mismatch with said predetermined acceptable values;
   the magnetoresistive sensor comprises at least one magnetoresistance of at least one of the following types: anisotropic magnetoresistance (AMR); giant magnetoresistance (GMR); tunnel magnetoresistance (TMR); and colossal magnetoresistance (CMR).

14. Apparatus for measuring a magnetic field using a magnetoresistive sensor, the apparatus being characterized in that it comprises at least one magnetoresistive sensor, measurement means for measuring the resistance of said magnetoresistive sensor, generator means for generating an additional magnetic field in the space containing the magnetoresistive sensor, and control means firstly for selectively controlling said generator means to apply an additional magnetic field pulse presenting a first value having a first polarity that is positive or negative and a magnitude sufficient for saturating the magnetoresistive sensor, and secondly for selectively controlling measurement of the resistance value of the magnetoresistive sensor by said measurement means and in that it comprises a processing device for use in situ prior to each measurement of the external magnetic field, said first processing device comprising a generating means for applying a first additional magnetic field pulse presenting a first value having positive polarity and magnitude sufficient to saturate the sensor, and measurement means for measuring the maximum value at high saturation $R_{max}$ of the resistance of the sensor, a generating means for applying a second additional magnetic field pulse presenting a second value having negative polarity and magnitude sufficient to saturate the sensor, and measurement means for measuring the minimum value at low saturation $R_{min}$ of the resistance of the sensor, and a processing device comprising means for applying a predetermined value of said additional magnetic field that does not saturate the sensor, measurement means for measuring the effective resistance $R_{eff}$ of the magnetoresistive sensor, and calibrating means for autocalibrating the effective resistance measurement $R_{eff}$ using the high saturation maximum value $R_{max}$ and the low saturation minimum value $R_{min}$ as previously measured in order to determine a corrected resistance $R_{cor}$ from which the value of the external magnetic field is determined.

15. Apparatus according to claim 14, characterized in that it further comprises storage means for storing calibration values of the resistance of the magnetoresistive sensor.

16. Apparatus according to claim 14, characterized in that the magnetoresistive sensor comprises at least one magnetoresistance of at least one of the following types: anisotropic magnetoresistance (AMR); giant magnetoresistance (GMR); tunnel magnetoresistance (TMR); and colossal magnetoresistance (CMR).

17. Apparatus according to claim 14, characterized in that the generator means for generating an additional magnetic field comprise an induction coil situated in the vicinity of the magnetoresistive sensor.

18. Apparatus according to claim 14, characterized in that the generator means for generating an additional magnetic field comprise a conductive sheet fed with current situated in the vicinity of the magnetoresistive sensor.

19. Apparatus according to claim 18, characterized in that the current-fed conductive sheet is disposed above or below the magnetoresistive sensor using a process that is integrated with interposing an intermediate layer of insulating material.

20. Apparatus according to claim 18, characterized in that the current-fed conductive sheet is situated on the face of the substrate opposite from its face carrying the magnetoresistive sensor.

21. Apparatus according to claim 14, characterized in that it further comprises means for verifying that the resistance values measured while said generator means are applying an additional magnetic field pulse are acceptable, and warning means responding to said means for verifying acceptability.

22. Apparatus for measuring a magnetic field using a magnetoresistive sensor, the apparatus being characterized in that it comprises at least one magnetoresistive sensor, measurement means for measuring the resistance of said magnetoresistive sensor, generator means for generating an additional magnetic field in the space containing the magnetoresistive sensor, and control means firstly for selectively controlling said generator means to apply an additional magnetic field pulse presenting a first value having a first polarity that is positive or negative and a magnitude sufficient for saturating the magnetoresistive sensor, and secondly for selectively controlling measurement of the resistance value of the magnetoresistive sensor by said measurement means and in that the measurement means for measuring the resistance of the magnetoresistive sensor comprise means for measuring the current needed to bring the measured resistance of the magnetoresistive sensor to a reference value ($R_{ref}$) lying between the extreme values ($R_{min}$, $R_{max}$) of the magnetoresistance of the magnetoresistive sensor as measured when said means for generating an additional magnetic field are activated, said reference value ($R_{ref}$) being a linear combination of said extreme values ($R_{min}$, $R_{max}$).

23. Apparatus for measuring a magnetic field using a magnetoresistive sensor, the apparatus being characterized in that it comprises at least one magnetoresistive sensor, measurement means for measuring the resistance of said magnetoresistive sensor, generator means for generating an additional magnetic field in the space containing the magnetoresistive sensor, and control means firstly for selectively controlling said generator means to apply an additional magnetic field pulse presenting a first value having a first polarity that is positive or negative and a magnitude sufficient for saturating the magnetoresistive sensor, and secondly for selectively controlling measurement of the resistance value of the magnetoresistive sensor by said measurement means and in that:

it comprises storage means for storing calibration value of the resistance of the magnetoresistance sensor and a processing device for use in situ prior to each measurement of the external magnetic field, said first processing device comprising a generating means for applying a first additional magnetic field pulse presenting a first value having positive polarity and magnitude sufficient to saturate the sensor, and measurement means for measuring the maximum value at high saturation $R_{max}$ of the resistance of the sensor, a generating means for applying a second additional magnetic field pulse presenting a second value having negative polarity and magnitude sufficient to saturate the sensor, and measurement means for measuring the minimum value at low saturation $R_{min}$ of the resistance of the sensor, and a processing device comprising means for applying a predetermined value of said additional magnetic field that does not saturate the sensor, measurement means for measuring the effective resistance $R_{eff}$ of the magnetoresistive sensor, and calibrating means for autocalibrating the effective resistance measurement $R_{eff}$ using the high saturation maximum value $R_{max}$ and the low saturation minimum value $R_{min}$ as previously measured in order to determine a corrected resistance $R_{cor}$ from which the value of the external magnetic field is determined;

the magnetoresistive sensor comprises at least one magnetoresistance of at least one of the following types: anisotropic magnetoresistance (AMR); giant magnetoresistance (GMR); tunnel magnetoresistance (TMR); and colossal magnetoresistance (CMR);

the generator means for generating an additional magnetic field comprise an induction coil situated in the vicinity of the magnetoresistive sensor;

the generator means for generating an additional magnetic field comprise a conductive sheet fed with current situated in the vicinity of the magnetoresistive sensor;

the current-fed conductive sheet is disposed above or below the magnetoresistive sensor using a process that is integrated with interposing an intermediate layer of insulating material;

the current-fed conductive sheet is situated on the face of the substrate opposite from its face carrying the magnetoresistive sensor;

it further comprises means for verifying that the resistance values measured while said generator means are applying an additional magnetic field pulse are acceptable, and warning means responding to said means for verifying acceptability;

the measurement means for measuring the resistance of the magnetoresistive sensor comprise means for measuring the current needed to bring the measured resistance of the magnetoresistive sensor to a reference value ($R_{ref}$) lying between the extreme values ($R_{min}$, $R_{max}$) of the magnetoresistance of the magnetoresistive sensor as measured when said means for generating an additional magnetic field are activated, said reference value ($R_{ref}$) being a linear combination of said extreme values ($R_{min}$, $R_{max}$).

* * * * *